United States Patent
Dalla Piazza et al.

(10) Patent No.: US 7,791,255 B2
(45) Date of Patent: Sep. 7, 2010

(54) PACKAGING FOR PIEZOELECTRIC RESONATOR

(75) Inventors: Silvio Dalla Piazza, St-Imier (CH); Thierry Hessler, St-Aubin (CH)

(73) Assignee: ETA SA Manufacture Horlogère Suisse, Grenchen (CH)

(*) Notice: Subject to any disclaimer, the term of this patent is extended or adjusted under 35 U.S.C. 154(b) by 111 days.

(21) Appl. No.: 12/270,337

(22) Filed: Nov. 13, 2008

(65) Prior Publication Data

US 2010/0117491 A1    May 13, 2010

(51) Int. Cl.
*H01L 41/08* (2006.01)

(52) U.S. Cl. .................... 310/348; 310/344; 257/678; 257/724

(58) Field of Classification Search ............. 310/344, 310/348; 257/678, 724
See application file for complete search history.

(56) References Cited

U.S. PATENT DOCUMENTS

| 2005/0104204 | A1 | 5/2005 | Kawakubo et al. | |
|---|---|---|---|---|
| 2005/0218488 | A1 | 10/2005 | Matsuo et al. | |
| 2007/0018539 | A1* | 1/2007 | Nagashima | 310/348 |
| 2007/0164637 | A1* | 7/2007 | Onozawa | 310/344 |
| 2007/0284970 | A1* | 12/2007 | Fujita | 310/344 |
| 2009/0127696 | A1* | 5/2009 | Matsumoto | 257/698 |
| 2009/0140613 | A1* | 6/2009 | Akane et al. | 310/348 |
| 2010/0066209 | A1* | 3/2010 | Saitou et al. | 310/340 |

FOREIGN PATENT DOCUMENTS

| EP | 1 803 684 A | 7/2007 |
|---|---|---|
| GB | 2 442 352 A | 4/2008 |

OTHER PUBLICATIONS

Search Report issued in corresponding application No. EP08169052, completed Mar. 6, 2009 and mailed Mar. 17, 2009.

* cited by examiner

*Primary Examiner*—Mark Budd
(74) *Attorney, Agent, or Firm*—Griffin & Szipl, P.C.

(57) ABSTRACT

The invention concerns an assembly comprising a piezoelectric resonator (14) and a case (10), the case including a base part (11), on which the resonator is mounted, a wall (12) extending from said base part so as to surround at least partially said resonator, and a cover fixed to said wall in such a way as to close said case. The base part includes a main portion (17) and at least two conductive vias (16a, 16b). The conductive vias electrically connect The piezoelectric resonator to an outside circuit through the base part, and each of the conductive vias is surrounded by a insulating lining (18) so as to insulate the vias from the main portion (17). The main portion (17) of the base part (11) is divided into two parts by an insulating partition (21) in such a way that the two conductive vias are on different sides of the partition.

7 Claims, 2 Drawing Sheets

PACKAGING FOR PIEZOELECTRIC RESONATOR

FIELD OF INVENTION

The present invention concerns packaging for piezoelectric resonators and more particularly for resonators of small dimensions which are most often used for making frequency generators in particular for portable electronic equipment, in numerous fields such as horology, information technology, telecommunications, and the medical field.

BACKGROUND OF THE INVENTION

Such packaging for quartz or piezoelectric resonators of small dimensions are of two different kinds in the prior art. A first kind of packaging consists in metal cases, which are not always available in SMD (Surface Mounted Device) versions, and whose minimal size is limited by technology. A second kind of packaging consists in ceramic cases, which are SMD, but whose size is limited by the technology of production as well as the tolerances of manufacturing.

In view of the increasingly pressing request of the market, SMD packages that are smaller and offer stronger resistance to the higher temperatures of reflow soldering are required. The above cited types of metallic or ceramic cases do not allow to manufacture satisfying packaging for the small resonators that are needed.

Thus according to existing packaging technology, either the overall size of the packaging 1 will be unacceptably large, or else the inside of the packaging will be so close to the resonator edges, that there will be a considerable risk of loss due to the tolerances of manufacturing. For instance as shown in FIG. 1, for a resonator 6 having a length of about 1.5 mm and a width of about 0.65 mm, a ceramic package 1 according to the prior art presents an external length of at least 2 mm and external width of at least 1.2 mm. Since the thickness of the package walls 2 are about 0.2 mm, the cavity 3 inside has a length of 1.6 mm and a width of about 0.8 mm. With the traditional manufacturing techniques, dimensions may be obtained with a precision of about 0.12 mm. Consequently, the internal sides 5 of the package risk to be very close to the edges of the resonator 6 especially in the corner 7 where a connection traverses the package 1 to make contact with the outside. This connection inevitably causes some leakages 8 that may short-circuit the resonator electrodes (not represented). The other possibility, which consists in manufacturing wider packages, is not a satisfactory solution because of miniaturization issues.

Within the scope of the present invention, alternative solutions have been investigated, among which cases made of silicon on insulator as shown in FIG. 2. Use of silicon allows manufacturing most of the package or case 10, namely the base part 11 and the wall 12 with small and accurate manufacturing limits. This better dimensional tolerance results from the use of a semiconductor photolithographic process and an etching technique such as DRIE (Deep Reactive Ion Etching), where the inner corners are not rounded. Thus for given external dimensions of the package 10, thanks to the previous point, a larger cavity 13 may be obtained. This in turn improves the mounting conditions of the resonator 14 (schematically represented as a crystal) within the case.

In this context, as shown in FIG. 2, a case 10 has been developed comprising a base part 11 and a wall 12, which are both made of silicon. The base part 11 and the wall 12 are etched from a silicon wafer of the Silicon On Insulator (SOI) type. Such a wafer is actually formed of two silicon layers joined by an intermediate layer of silicon oxide. The silicon forming the layer out of which the base part is etched is preferably doped so as to render it conductive, while the silicon forming the layer out of which the wall is etched is preferably non doped so as to render it almost insulating. The silicon base part 11 includes two conductive vias 16a and 16b arranged to connect the inside piezoelectric resonator 14, for instance a crystal of quartz, to an outside circuit (not shown) through the base part 11. The conductive vias 16a and 16b are insulated from the rest of the base part 17 by a dielectric lining 18. Further, for the connection between the resonator 14 and the outside circuit, inner electrodes (20a and 20b) and outer electrodes (19a and 19b) are provided inside and outside case 10 respectively.

Even non doped silicon can conduct electricity considerably better than ceramic for instance. Accordingly, one problem with the silicon packaging shown in FIG. 2 is the considerable static capacity of the assembly formed by the case 10 and the resonator 14. As shown in FIG. 2 and schematically in FIG. 3, such a package design is equivalent to connecting several capacities C1, C2 and C3 in parallel with the crystal (i.e. the resonator). Consequently the overall static capacity of the assembly is drastically increased, which is harmful in the desired applications. Referring now to FIGS. 2 and 3, it can be seen that the total capacity between one via and the bulk of the base plate is:

$$C4 = C1 + C2 + C3$$

Then the overall static capacity in parallel with the crystal is the following:

$$C_P = C4/2$$

The different capacities C1, C2, C3 are determined by the thickness of insulating material, i.e. dielectric. For instance if we consider an equivalent capacity C4 of 18 pF, a quick estimate of the static capacity Cp leads to a value of 9 pF which is about 15 times greater than the typical values obtained with ceramic packages.

SUMMARY OF THE INVENTION

The main goal of the present invention is to overcome the aforementioned problem by providing a package which combines better dimensional tolerances, coming from manufacturing technology, with relatively low static capacity, comparable to the static capacity of ceramic casings.

To this end, the invention concerns an assembly comprising a piezoelectric resonator and a case, said case including a base part, on which said resonator is mounted, a wall extending from said base part so as to surround at least partially said resonator, and a cover fixed to said wall in such a way as to close said case, the base part and the wall being made of silicon and being separated by a dielectric layer, wherein the base part includes a main portion and at least two conductive vias, the conductive vias electrically connecting said piezoelectric resonator to an outside circuit through the base part, and each of the conductive vias being surrounded by a insulating lining so as to insulate said vias from the main portion of the base part, characterized in that said main portion is divided into two parts by an insulating partition in such a way that the two conductive vias are on different sides of said partition.

Such an assembly allows monitoring and minimizing the static capacity value of the whole. To achieve this, the insulating partition made in the bottom of the case between the vias introduces a capacity in series with the total capacity in parallel with the resonator so that the overall static capacity is reduced. Thus compared to the example taken before, insertion of such an insulating partition can reduce the capacity value by a factor of 10, which leads finally to a quite acceptable value for the desired applications, comparable to ceramic casing capacity values.

According to an advantageous embodiment, the insulating partition is a trench filled with an insulating material. When designing the trench, in particular by selecting its width, as well as the dielectric constant of the insulating material, it is possible to determine the capacity value which is in series with the parallel capacities.

According to an advantageous embodiment, the dielectric layer separating the base part from the wall, the insulating lining of the vias, and the insulating partition are all formed by dielectric $SiO_2$ oxide layers.

According to a particular embodiment of the present invention, the silicon from which the base part is made is doped so as to render it electrically conducting. Furthermore, the conductive vias are made from the same doped silicon as the main portion of the base plate. Making the vias and the main portion of the base part from the same doped silicon considerably simplifies the production of the package. Furthermore, According to this embodiment, the insulating lining of each of the vias can, for instance, be formed by a peripheral trench etched through said doped silicon and filled with an insulating material.

According to an alternative embodiment of the present invention, the conductive vias are in the form of holes through the silicon base part, said holes being lined with an insulating dielectric and filled with electrically conducting material. An advantage associated with this alternative embodiment is that the silicon forming the base part can be non doped. In this way, the electrical conductivity of the main part of the base part can be considerably reduced. Furthermore, According to this alternative embodiment, said electrically conducting material is preferably metal. The metal vias can for instance be made by electroforming.

BRIEF DESCRIPTION OF THE DRAWINGS

Other features and advantages of the invention will appear upon reading the following exemplary description which refers to the annexed drawings in which.

DETAILED DESCRIPTION OF THE INVENTION

A first exemplary embodiment of the present invention will now be described by way of non limiting examples in relation with FIGS. 4 and 6. For ease of comprehension of the following description, the expression "package" should be understood as meaning the combination of a case and a piezoelectric resonator contained in the case.

Figure 4:
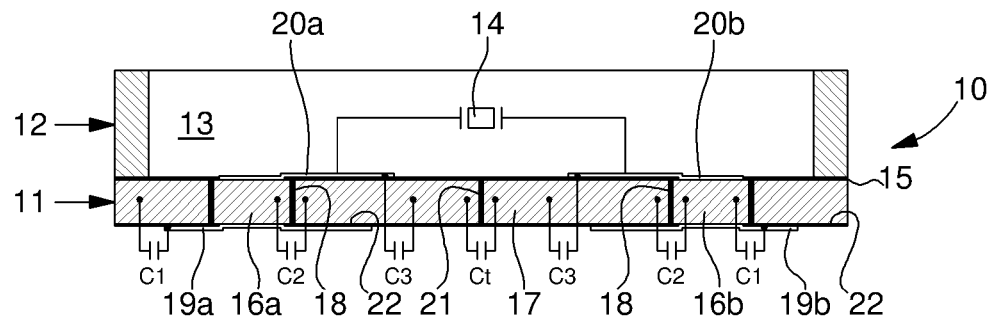
FIG. 4 is a cut view of an opened silicon package according to a first embodiment of the invention.

FIG. 4 is a cut view of an opened package according to an embodiment of the invention. The package comprises a piezoelectric resonator 14, schematically illustrated, and which is preferably made of a crystal of quartz, mounted in a case 10. The piezoelectric resonator 14 is preferably in the form of a tuning fork resonator that may have a central arm forming a linking base with the case 10. However, it is obviously understood that any other kind of traditional resonator, e.g. tuning fork without a central arm, can be mounted in the case, dimensions of which having been adequately modified.

Both the base part 11 on which the resonator is mounted, and the wall 12 surrounding the resonator, are made of silicon. Thus, thickness of the sides walls are manufactured with high accuracy by using a photolithographic process and silicon etching, so that either the inside cavity 13 can be bigger or the overall size of the case 10 can be reduced for a same size resonator 14. Preferably, the etching process used is Deep Reactive Ion Etching (DRIE). Thus, in this example the remaining space between the inner faces of the case 10 and corresponding facing edges of the resonator 14 is much wider than in the prior art. Consequently, risks of short-circuits as well as obstruction to vibrations of the resonator are avoided.

As previously explained, the base part 11 and the wall 12 are made from a SOI (silicon on insulator) wafer, i.e. actually two joined silicon wafers with a dielectric 15 in between, such as an oxide layer of $SiO_2$. According the presently described embodiment of the invention, one of the two silicon wafers is heavily doped, while the other silicon wafer is preferably non-doped. The base part 11 is etched from the heavily doped silicon wafer so that it is a good conductor of electricity. As can be seen in FIG. 4, the exposed underside of the conductive wafer 11 is covered by an insulating layer 22 arranged to avoid the conductive silicon causing short circuits. The insulating layer 22 can be formed by any compatible dielectric, in particular silicon oxide, possibly even native silicon oxide.

As shown in FIG. 4, the silicon base part 11 includes two conductive vias 16a and 16b over and under which portions of the insulating layers 15 and 22 have been removed in order to give access to the conductive silicon. The vias 16a and 16b are arranged to electrically connect the piezoelectric resonator 14 inside the package to an outside circuit (not shown) through the base part 11. The two vias are separated from the rest of the base part (i.e. the main part 17) by respective insulating linings 18. According to the present embodiment, these insulating linings 18 are formed by trenches filled with a dielectric material. A person with ordinary skill in the art knows how to form such insulating linings by first etching a deep trench through the doped silicon wafer, and then filing the trench with an appropriate dielectric material such as silicon oxide ($SiO_2$) for example. In association with the layers 15 and 22, the linings 18 form an insulating structure capable of preventing any short circuit through the main portion 17 of the base part 11.

As can further be seen on FIG. 4, inner connection pads (20a and 20b) and outer connection pads (19a and 19b) are provided inside and outside case 10 respectively. These connection pads can be formed by metallization layers, such as gold layers, deposited directly on the exposed conductive silicon of the vias 16a et 16b, in the places where portions of the insulating layers 15 and 22 have been removed. In order to make connections easier in particular in the case of an SMD (surface mounted device), the surface area of each of the connection pads 19a, 19b, 20a, 20b is preferably considerably larger than the cross-section of a via. This is the reason why the metallization layers 19a, 19b, 20a, 20b shown in FIG. 4 overlap the insulating layers 15 and 22.

Figure 3:
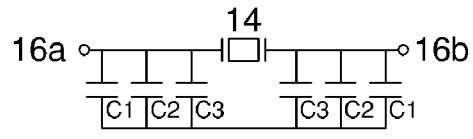
FIG. 3 is an equivalent schematic in terms of capacity for FIG. 2.

It will be understood that the combination of a base part 11 made out of doped silicon and of an insulating structure formed by the layers 15 and 22 and the linings 18, there is no more need to pass through a corner of the case to make connections with the outside. However, as mentioned in the introduction of this description, it has been revealed within the scope of the present invention that such an arrangement introduces several capacities in parallel with the resonator 14. As shown in FIGS. 3 and 4, firstly, capacities between the two inside connection pads 19a and 19b and the main portion 17 are referenced C3, secondly, capacities between the two outside connection pads 20a and 20b and the main portion 17 are referenced C1, and finally, capacities between the two vias 16a and 16b and the main portion 17 are referenced C2. As previously indicated FIG. 3 is a schematic equivalent showing how the capacities C1, C2 and C3 compete with the resonator 14, in particular in terms of power consumption.

According to the present invention, the effect of the capacities C1, C2 and C3 is minimised by adding an additional small capacity in series with these capacities. To achieve this, an insulating partition 21 divides the base part 11 into two blocks. The insulating partition can be formed by the same process used to form the lining around each of the vias 16a and 16b. That is to say, by first micromachining a deep trench through the doped silicon wafer, and then filing the trench with an appropriate insulating material. This material may be the same dielectric (for instance $SiO_2$), already used for the insulation structure 18, 15 and 22 of vias. According to the example depicted in FIG. 4, the insulating partition 21 is in the form of a straight line separating the main portion 17 into two substantially equal parts. A partition in the form of a straight line is advantageous because of its reduced length relative to a curved partition. However, the invention is not limited to partitions in the form of a straight line. For example, it is possible to have a partition in the form of an arc of circle substantially concentric with one of the vias. The only limitation imposes by the present invention is that the two conductive vias 16a and 16b are on opposite sides of the partition 21.

Figure 6:
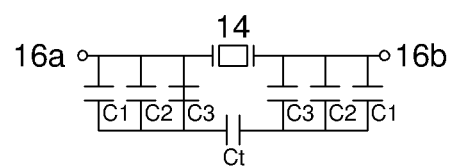
FIG. 6 is an equivalent schematic in terms of capacity for either FIG. 4 of FIG. 5.

As shown in FIGS. 4 and 6, the partition 21 behaves like an additional capacitor, having a capacity Ct, which is in series with the aforementioned capacities C1, C2, C3. As is well known by the person skilled in the art, the size of the capacity Ct depends both on the dimensions (area and width) of the partition and on the dielectric constant of the insulator used to fill the trench. If the capacity Ct is made small enough, its effect is to reduce the total capacity in parallel with the resonator as will be shown in relation with FIG. 6. According to the dimension of the trench, the equivalent capacity in parallel with the resonator may be reduced by a factor of 10, which leads to an acceptable value for the desired applications, comparable to those obtained with a standard ceramic package.

FIG. 6 is an equivalent schematic in terms of capacity of FIG. 4. As shown capacities C1, C2 and C3 are connected in parallel with the resonator 14 on each side of it. The capacity Ct of the partition is arranged in series with these three capacities. If we define C4 as the capacity equivalent to the three capacities connected in parallel (i.e. C4=C1+C2+C3), the overall static capacity in parallel with the resonator 14 is as follows:

$$1/Cp = 1/C4 + 1/Ct + 1/C4$$

which leads to the final expression:

$$Cp = (C4 \cdot Ct)/(2Ct + C4)$$

Figure 1:
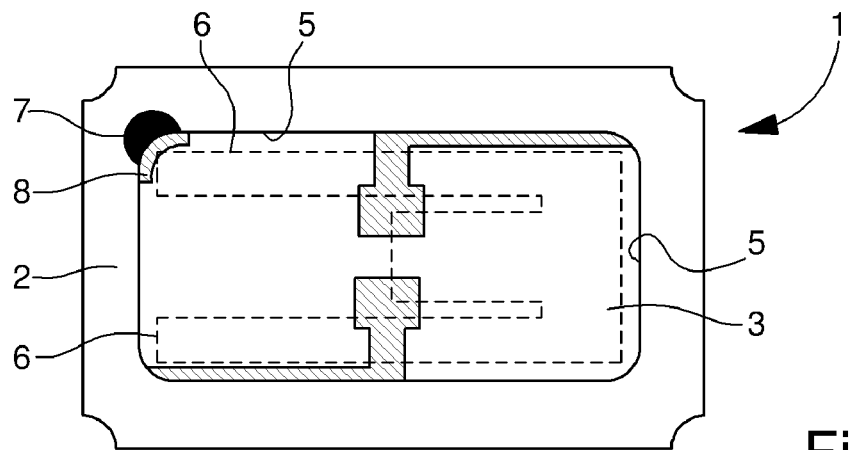
FIG. 1 is a top and cut view of an opened package according to the prior art.
Figure 2:
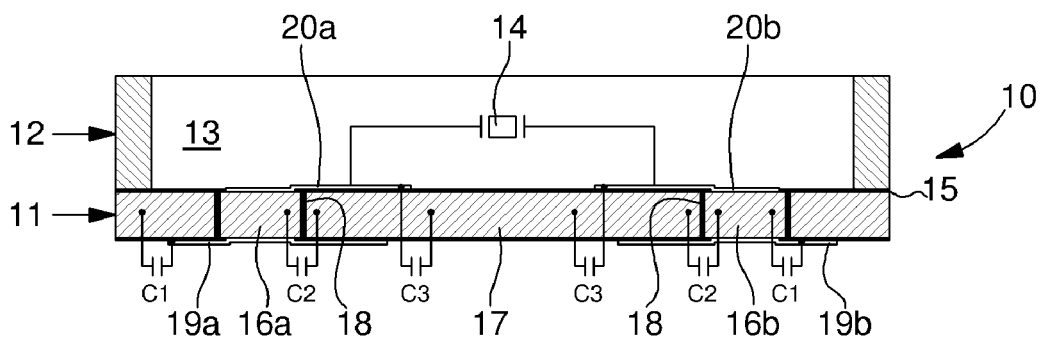
FIG. 2 is a cut view of an opened silicon package.

The design of the trench 21 can be chosen so that capacity Ct has a value equal to 1 pF (picofarad). Considering that C4 has a value of 18 pF (as seen in the first example), a quick estimate of the overall static capacity Cp leads to a value about 0.9 pF which is reduced by a factor of 10 compared to this example of FIG. 2.

Figure 5:
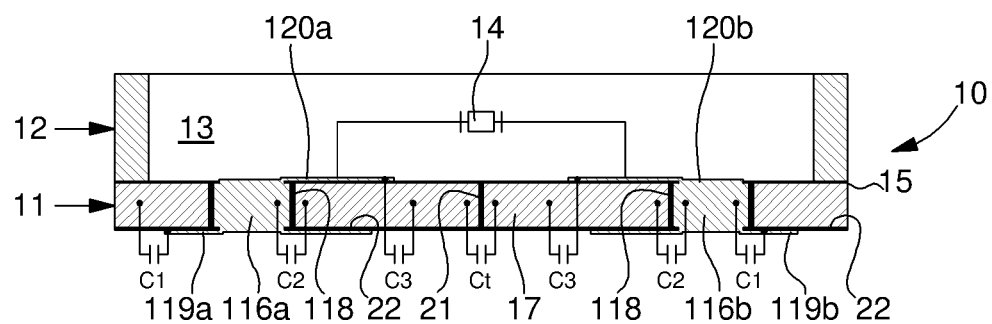
FIG. 5 is a cut view of an opened silicon package according to a second embodiment of the invention.

FIG. 5 is a cut view of an opened package according to second embodiment of the invention. The package comprises a piezoelectric resonator 14 which can be the same as the one used in the example corresponding to FIG. 4. The distinguishing feature of the package depicted in FIG. 5 is that the vias are made out of metal instead of being formed from the same silicon that makes up the rest of the base part 11. The elements depicted in FIG. 5 that are identical the corresponding elements depicted in FIG. 4 are referenced using the same reference numbers. The vias 116a and 116b of the second embodiment can be made by micromachining and electroforming. One possible method is to first etch two holes through the silicon substrate all the way to the oxide layer 15. Once the etching step is completed, an oxide liner 118 is formed on the walls of each one of the holes. A thin metallization layer is then deposited inside the holes over all the exposed oxide surfaces. The metallization also extends over a portion of the surface of the wafer so as to form the contact pads 119a and 119b. The vias 116a and 116b are then formed by filling the holes with metal by means of an electroforming process.

Having described the invention with regard to certain specific embodiments, it is to be understood that these embodiments are not meant as limitations of the invention. Indeed, various modifications, adaptations and/or combination between embodiments may become apparent to those skilled in the art without departing from the scope of the annexed claims.

What is claimed is:

1. An assembly comprising a piezoelectric resonator and a case, said case including a base part, on which said resonator is mounted, a wall extending from said base part so as to surround at least partially said resonator, and a cover fixed to said wall in such a way as to close said case, the base part and the wall being made of silicon and being separated by a dielectric layer, wherein the base part includes a main portion and at least two conductive vias, the conductive vias electrically connecting said piezoelectric resonator to an outside circuit through the base part, and each of the conductive vias being surrounded by a insulating lining so as to insulate said vias from the main portion, wherein said main portion is divided into two parts by an insulating partition in such a way that the two conductive vias are on different sides of said partition.

2. The assembly according to claim 1, wherein said insulating partition is a trench filled with an insulating material.

3. The assembly according to claim 1, wherein the dielectric layer separating the base part from the wall, the insulating lining of the vias, and the insulating partition are all formed by dielectric oxide layers.

4. The assembly according to claim 1, wherein the silicon of which the base part is made is doped so as to render it electrically conducting, and wherein the conductive vias are made of the same doped silicon as the main portion.

5. The assembly according to claim 4, wherein the insulating lining of each of the vias is a peripheral trench etched through said doped silicon and filled with an insulating material.

6. The assembly according to claim 1, wherein the conductive vias are in the form of holes through the silicon base part, said holes being lined with an insulating dielectric and filled with electrically conducting material.

7. The assembly according to claim 6, wherein said electrically conducting material is metal.

* * * * *